(12) United States Patent
Mahler et al.

(10) Patent No.: US 8,288,207 B2
(45) Date of Patent: Oct. 16, 2012

(54) METHOD OF MANUFACTURING SEMICONDUCTOR DEVICES

(75) Inventors: Joachim Mahler, Regensburg (DE); Edward Fuergut, Dasing (DE); Manfred Mengel, Bad Abbach (DE)

(73) Assignee: Infineon Technologies AG, Neubiberg (DE)

( * ) Notice: Subject to any disclaimer, the term of this patent is extended or adjusted under 35 U.S.C. 154(b) by 242 days.

(21) Appl. No.: 12/371,044

(22) Filed: Feb. 13, 2009

(65) Prior Publication Data
US 2010/0210071 A1 Aug. 19, 2010

(51) Int. Cl.
H01L 23/48 (2006.01)
(52) U.S. Cl. .............. 438/110; 257/E23.001
(58) Field of Classification Search .......... 438/106, 438/110, 113, 121, 127, 460, 464; 257/678, 257/723, E23.001
See application file for complete search history.

(56) References Cited

U.S. PATENT DOCUMENTS

| | | | |
|---|---|---|---|
| 3,903,590 A * | 9/1975 | Yokogawa | 438/107 |
| 5,847,445 A * | 12/1998 | Wark et al. | 257/669 |
| 6,040,229 A * | 3/2000 | Kuriyama | 438/396 |
| 6,498,099 B1 * | 12/2002 | McLellan et al. | 438/689 |
| 6,566,749 B1 * | 5/2003 | Joshi et al. | 257/706 |
| 6,585,905 B1 * | 7/2003 | Fan et al. | 216/14 |
| 6,586,280 B2 * | 7/2003 | Cheah | 438/122 |
| 7,226,811 B1 * | 6/2007 | McLellan et al. | 438/111 |
| 7,371,610 B1 * | 5/2008 | Fan et al. | 438/112 |
| 7,544,541 B2 * | 6/2009 | Low et al. | 438/113 |
| 7,838,972 B2 * | 11/2010 | Hojo | 257/676 |
| 7,872,336 B2 * | 1/2011 | Abbott | 257/666 |
| 2005/0200006 A1 * | 9/2005 | Pu et al. | 257/723 |
| 2006/0091488 A1 * | 5/2006 | Kang | 257/433 |
| 2006/0141750 A1 * | 6/2006 | Suzuki et al. | 438/460 |
| 2007/0001278 A1 | 1/2007 | Jeon et al. | |
| 2007/0059863 A1 * | 3/2007 | Li et al. | 438/113 |
| 2007/0099339 A1 * | 5/2007 | Chang | 438/106 |
| 2007/0138614 A1 * | 6/2007 | Harrison et al. | 257/686 |
| 2007/0278701 A1 * | 12/2007 | Chang et al. | 257/787 |
| 2008/0116580 A1 * | 5/2008 | Jiang et al. | 257/766 |
| 2008/0185671 A1 * | 8/2008 | Huang et al. | 257/432 |
| 2008/0203511 A1 * | 8/2008 | Huang et al. | 257/434 |
| 2008/0230913 A1 * | 9/2008 | Huang et al. | 257/762 |
| 2008/0251937 A1 * | 10/2008 | Chang et al. | 257/777 |
| 2008/0258306 A1 * | 10/2008 | Chang et al. | 257/762 |
| 2008/0268578 A1 * | 10/2008 | Shimanuki et al. | 438/124 |
| 2008/0283971 A1 * | 11/2008 | Huang et al. | 257/620 |
| 2008/0296716 A1 * | 12/2008 | Chan et al. | 257/433 |
| 2008/0315412 A1 * | 12/2008 | Liang et al. | 257/737 |
| 2009/0008769 A1 * | 1/2009 | Kroener | 257/699 |
| 2009/0068831 A1 * | 3/2009 | Enquist et al. | 438/618 |

* cited by examiner

*Primary Examiner* — Jarrett Stark
*Assistant Examiner* — Michele Fan
(74) *Attorney, Agent, or Firm* — Dicke, Billig & Czaja, PLLC (57) ABSTRACT

A method of manufacturing a semiconductor device. The method includes providing a metal carrier, attaching chips to the carrier, and applying a metal layer over the chips and the metal carrier to electrically couple the chips to the metal carrier. The metal carrier is segmented, after applying the metal layer, to obtain metal contact elements.

20 Claims, 9 Drawing Sheets

METHOD OF MANUFACTURING SEMICONDUCTOR DEVICES

BACKGROUND

Electronic packaging continues to evolve and impact the electronics industry. The trend toward smaller, lighter, and thinner consumer products requires further packaging improvements. Surface-mount technology (SMT) and ball grid array (BGA) packages allow reduction of pad pitch on the printed circuit board. Chip-scale or chip-size packaging (CSP) includes packages having areas that are little more than the original die area. Wafer-level packaging (WLP) and lead-frame-based CSP are types of CSP.

WLP refers to packaging an integrated circuit at wafer level, instead of assembling the package of each individual unit after wafer dicing. WLP extends the wafer fabrication process to include device connection and device protection processes. Often, in WLP a completely packaged wafer is burned-in and tested after the final packaging step, such that tests before packaging are no longer necessary.

Lead-frame-based CSP refers to packaging semiconductor chips at a lead-frame array packaging level, instead of the traditional process of packaging semiconductor chips one at a time. Lead-frame-based CSP uses wafer level fabrication processes for connecting and protecting devices, which reduces packaging time, inventory and costs.

For these and other reasons, there is a need for the present invention.

SUMMARY

One embodiment described in the disclosure provides a method of manufacturing a semiconductor device. The method includes providing a metal carrier, attaching chips to the carrier, and applying a metal layer over the chips and the metal carrier to electrically couple the chips to the metal carrier. The metal carrier is segmented, after applying the metal layer, to obtain metal contact elements.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

FIGS. 1-4 are diagrams illustrating one embodiment of a method of manufacturing semiconductor devices.

Figure 1:
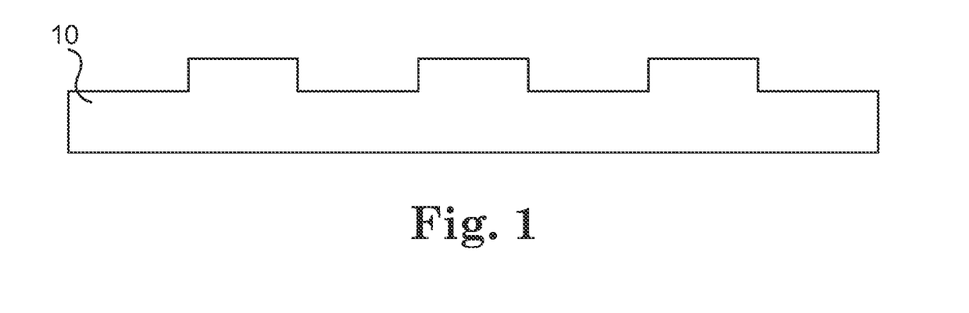
FIG. 1 is a diagram illustrating one embodiment of a metal carrier.

FIG. 1 is a diagram illustrating one embodiment of a metal carrier 10.

Figure 2:
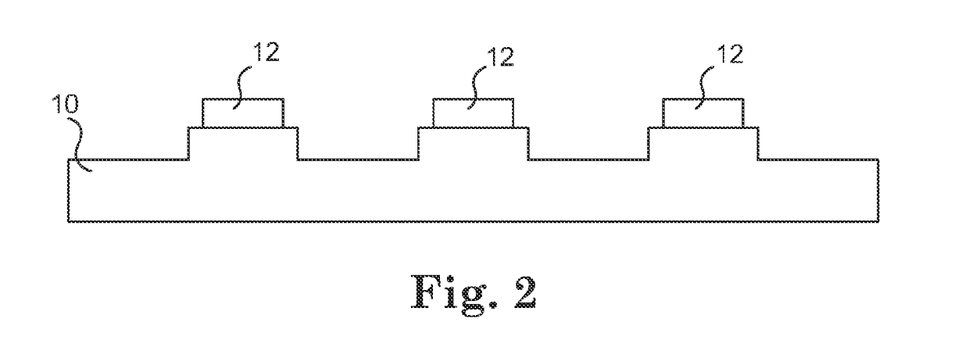
FIG. 2 is a diagram illustrating one embodiment of chips attached to the metal carrier.

FIG. 2 is a diagram illustrating one embodiment of chips 12 attached to the metal carrier 10.

Figure 3:
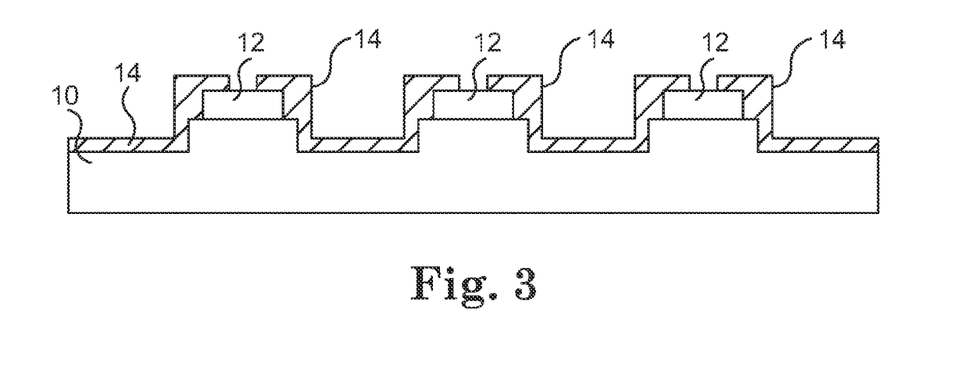
FIG. 3 is a diagram illustrating one embodiment of a metal layer applied over the chips and the metal carrier.

FIG. 3 is a diagram illustrating one embodiment of a metal layer 14 applied over the chips 12 and the metal carrier 10 to electrically couple the chips 12 to the metal carrier 10.

Figure 4:
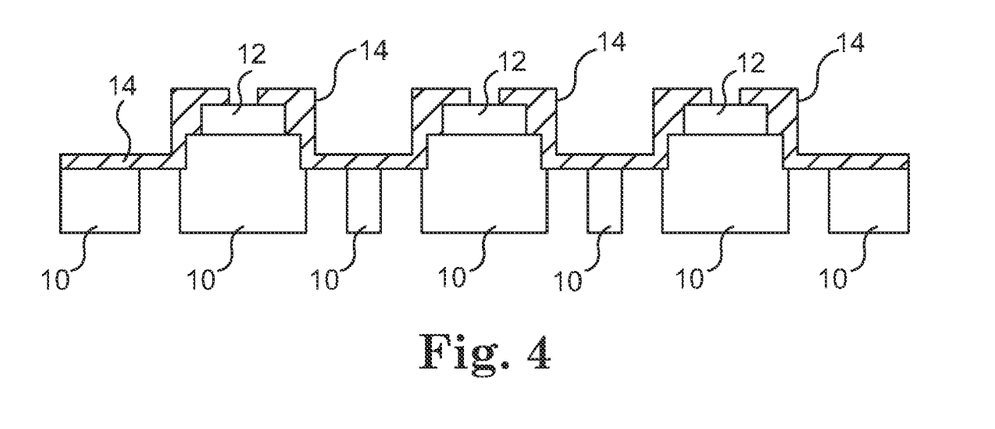
FIG. 4 is a diagram illustrating one embodiment of segmenting the metal carrier, after applying the metal layer.

FIG. 4 is a diagram illustrating one embodiment of segmenting the metal carrier 10, after applying the metal layer 14, to obtain metal contact elements.

FIGS. 5-9 are diagrams illustrating one embodiment of a method of manufacturing semiconductor devices.

Figure 5:
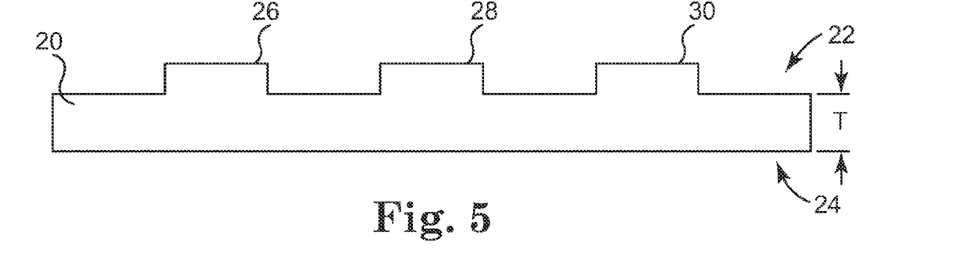
FIG. 5 is a diagram illustrating one embodiment of a metal carrier used to manufacture semiconductor devices.

FIG. 5 is a diagram illustrating one embodiment of a metal carrier 20 used to manufacture the semiconductor devices. Metal carrier 20 has a thickness T that can extend up to 2 millimeters (mm). In one embodiment, metal carrier 20 is a metal plate. In one embodiment, metal carrier 20 is a metal foil. In one embodiment, metal carrier 20 is copper. In one embodiment, metal carrier 20 is a copper lead-frame. In one embodiment, metal carrier 20 has a thickness T in the range from 50 micrometer (um) to 500 um.

Metal carrier 20 includes a first side 22 and a second side 24. First side 22 has been previously structured to include plateaus 26, 28 and 30. In other embodiments, first side 22 is substantially planar.

Figure 6:
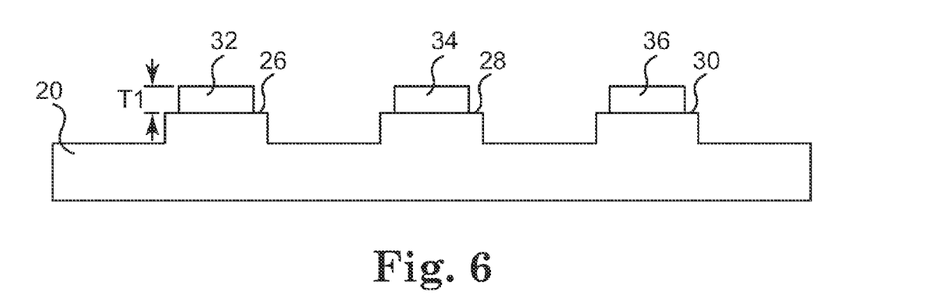
FIG. 6 is a diagram illustrating one embodiment of semiconductor chips attached to the metal carrier.

FIG. 6 is a diagram illustrating one embodiment of semiconductor chips 32, 34 and 36 attached to metal carrier 20. Semiconductor chip 32 is attached to plateau 26, chip 34 is attached to plateau 28 and chip 36 is attached to plateau 30. In one embodiment, each of the chips 32, 34 and 36 is attached to metal carrier 20 via one or more plating layers situated between the chip and the plateau. In one embodiment, each of the chips 32, 34 and 36 is attached via diffusion soldering. In one embodiment, each of the chips 32, 34 and 36 is attached via soft soldering. In one embodiment, each of the chips 32, 34 and 36 is attached via glue die attach. In other embodiments, chips 32, 34 and 36 are attached to a substantially planar side one 22 of metal carrier 20 and not to plateaus.

Chips 32, 34 and 36 are suitable semiconductor chips. Each of the chips 32, 34 and 36 has a chip thickness T1 in the range from 5 um to 400 um. In one embodiment, at least one of the chips 32, 34 and 36 includes a power transistor. In one embodiment, at least one of the chips 32, 34 and 36 includes a vertical power transistor. In one embodiment, at least one of the chips 32, 34 and 36 includes a vertical power MOSFET transistor.

Figure 7:
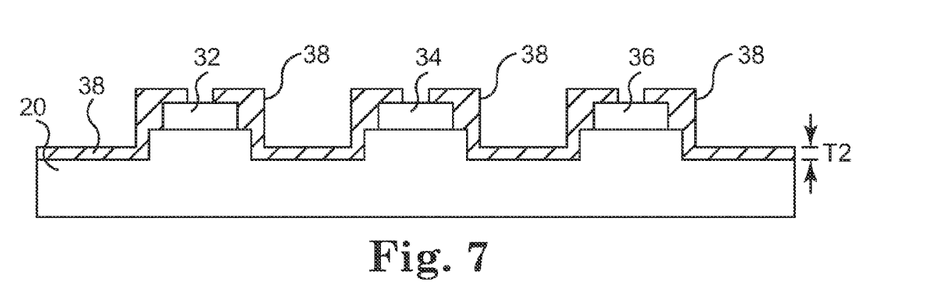
FIG. 7 is a diagram illustrating one embodiment of a metal layer applied over the chips and the metal carrier.

FIG. 7 is a diagram illustrating one embodiment of a metal layer 38 applied over chips 32, 34 and 36 and metal carrier 20. Metal layer 38 electrically couples chips 32, 34 and 36 to metal carrier 20 and can be structured over chips 32, 34 and 36 and metal carrier 20. In one embodiment, metal layer 38 includes silver. In one embodiment, metal layer 38 includes copper.

Metal layer 38 has a metal layer thickness T2 in the range from 10 um to 250 um. In one embodiment, metal layer 38 is applied via an electrochemical (galvanic) process. In one embodiment, metal layer 38 is applied via depositing a seed layer and electroplating. In one embodiment, metal layer 38 is applied via an inkjet process. In one embodiment, metal layer 38 is applied via an inkjet process using nanoparticles, such as silver and/or copper nanoparticles, that melt at higher than 150 degrees centigrade.

Figure 8:
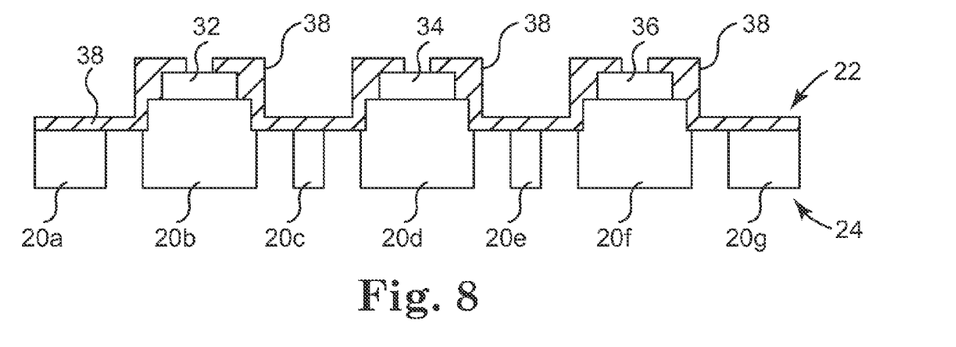
FIG. 8 is a diagram illustrating one embodiment of the metal carrier of FIG. 5 segmented after applying the metal layer.

FIG. 8 is a diagram illustrating one embodiment of a metal carrier 20 segmented after applying metal layer 38. Metal carrier 20 is segmented into metal carrier segments 20a-20g to obtain metal contact elements. Material from metal carrier 20 is completely removed from between metal carrier segments 20a-20g to avoid short circuits. In one embodiment, metal carrier 20 is segmented via etching metal carrier 20 from second side 24. In one embodiment, metal carrier 20 is segmented via selective copper etching.

Figure 9:
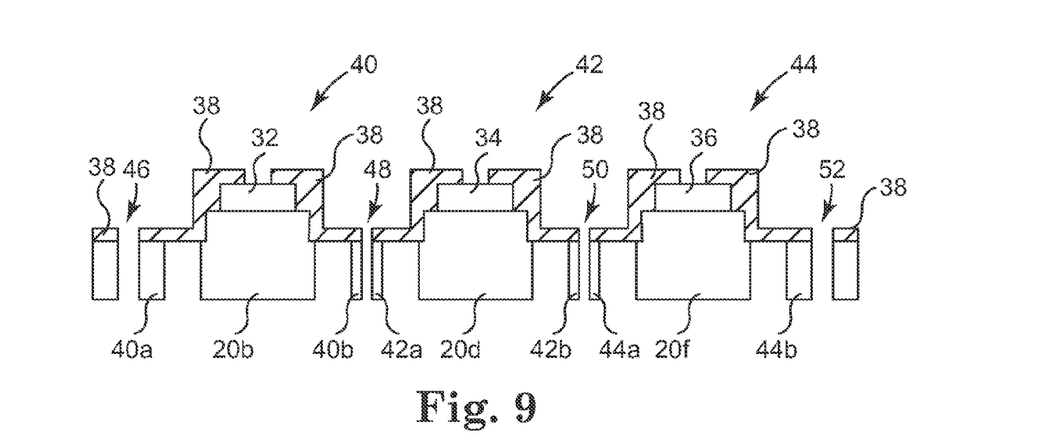
FIG. 9 is a diagram illustrating one embodiment of the metal layer segmented to provide multiple semiconductor devices.

FIG. 9 is a diagram illustrating one embodiment of metal layer 38 segmented to provide multiple semiconductor devices 40, 42 and 44. Metal layer 38 and metal carrier 20 are segmented at 46, 48, 50 and 52 to provide multiple semiconductor devices 40, 42 and 44. Semiconductor device 40 includes chip 32, metal carrier segment 20b and metal contact elements 40a and 40b. Semiconductor device 42 includes chip 34, metal carrier segment 20d and metal contact elements 42a and 42b. Semiconductor device 44 includes chip 36, metal carrier segment 20f and metal contact elements 44a and 44b. In one embodiment, metal layer 38 is segmented via etching. In one embodiment, metal layer 38 is segmented via mechanical dicing, such as sawing. In one embodiment, metal layer 38 is segmented via laser irradiation.

FIGS. 10-16 are diagrams illustrating another embodiment of a method of manufacturing semiconductor devices.

Figure 10:
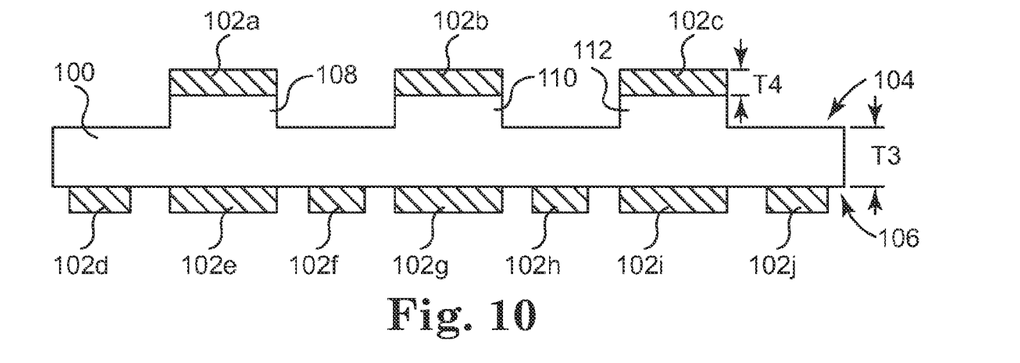
FIG. 10 is a diagram illustrating one embodiment of a metal carrier and metal plating used to manufacture semiconductor devices.

FIG. 10 is a diagram illustrating one embodiment of a metal carrier 100 and metal plating 102a-102j used to manufacture the semiconductor devices. In one embodiment, metal carrier 100 is a metal plate. In one embodiment, metal carrier 100 is a metal foil. In one embodiment, metal carrier 100 is copper. In one embodiment, metal carrier 100 is a copper lead-frame.

Metal carrier 100 has a thickness T3 that can extend up to 2 mm, and metal plating 102a-102j has a thickness T4 in the range from 100 nanometers (nm) to 20 um. In one embodiment, metal carrier 100 has a thickness T3 in the range from 50 um to 500 um. In one embodiment, metal plating 102a-102j has a thickness T4 in the range from 1 um to 5 um.

Metal carrier 100 includes a first side 104 and a second side 106. First side 104 has been previously structured to include plateaus 108, 110 and 112. In other embodiments, first side 104 is substantially planar.

Metal carrier 100 has been selectively plated with metal plating 102a-102j. Plateau 108 has been plated with metal plating 102a, plateau 110 has been plated with metal plating 102b and plateau 112 has been plated with metal plating 102c. In addition, the second side 106 of metal carrier 100 has been selectively plated with metal plating 102d-102j. In one embodiment, metal plating 102a-102j includes silver. In one embodiment, metal plating 102a-102j includes tin. In one embodiment, metal plating 102a-102j is applied via an electro-chemical (galvanic) plating process.

Figure 11:
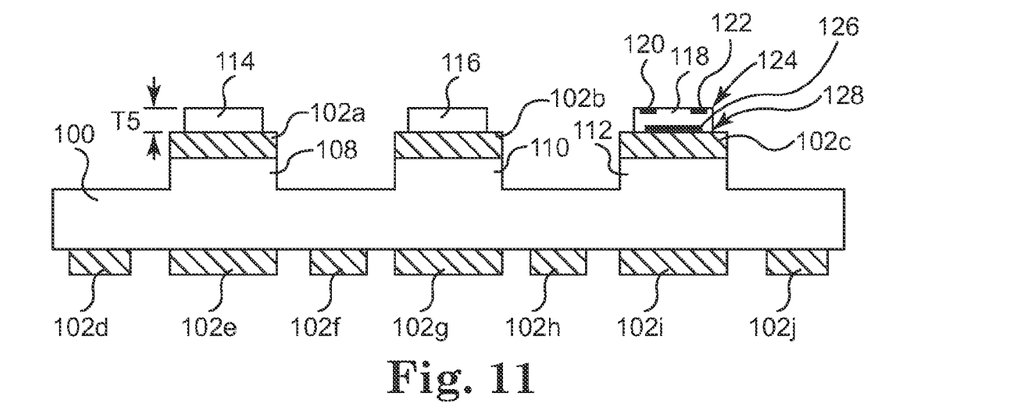
FIG. 11 is a diagram illustrating one embodiment of semiconductor chips attached to the metal carrier via the metal plating.

FIG. 11 is a diagram illustrating one embodiment of semiconductor chips 114, 116 and 118 attached to metal carrier 100 via metal plating 102a-102c, respectively. Semiconductor chip 114 is attached to metal plating 102a on plateau 108, chip 116 is attached to metal plating 102b on plateau 110 and chip 118 is attached to metal plating 102c on plateau 112. In one embodiment, each of the chips 114, 116 and 118 is attached via diffusion soldering. In one embodiment, each of the chips 114, 116 and 118 is attached via soft soldering. In one embodiment, each of the chips 114, 116 and 118 is attached via glue die attach. In other embodiments, chips 114, 116 and 118 are attached to a substantially planar side one 104 of metal carrier 100 and not to plateaus.

Chips 114, 116 and 118 are suitable semiconductor chips. Each of the chips 114, 116 and 118 has a chip thickness T5 in the range from 5 um to 400 um. In one embodiment, at least two of the chips 114, 116 and 118 are different chips. In one embodiment, at least one of the chips 114, 116 and 118 includes a power transistor. In one embodiment, at least one of the chips 114, 116 and 118 includes a vertical power transistor. In one embodiment, at least one of the chips 114, 116 and 118 includes a vertical power MOSFET transistor.

In one embodiment, each of the chips 114, 116 and 118 includes a vertical power transistor, as shown via chip 118. The vertical power transistors in chips 114 and 116 are not shown for clarity. Chip 118 includes a vertical power transistor having two contacts 120 and 122 on one face 124 and one contact 126 on an opposing face 128. The two contacts 120 and 122 face away from metal carrier 100 and the one contact 126 faces metal carrier 100. In the on state, current flows between faces 124 and 128.

In one embodiment, each of the chips 114, 116 and 118 includes a vertical power MOSFET transistor, as shown via chip 118. For clarity, the vertical power transistors in chips 114 and 116 are not shown. Chip 118 includes a vertical power MOSFET having a source contact 120 and a gate contact 122 on the one face 124 and a drain contact 126 on the opposing face 128. The source and gate contacts 120 and 122 face away from metal carrier 100 and the drain contact 126 faces metal carrier 100. In the on state, current flows between the source contact 120 and drain contact 126 on opposing faces 124 and 128.

Figure 12:
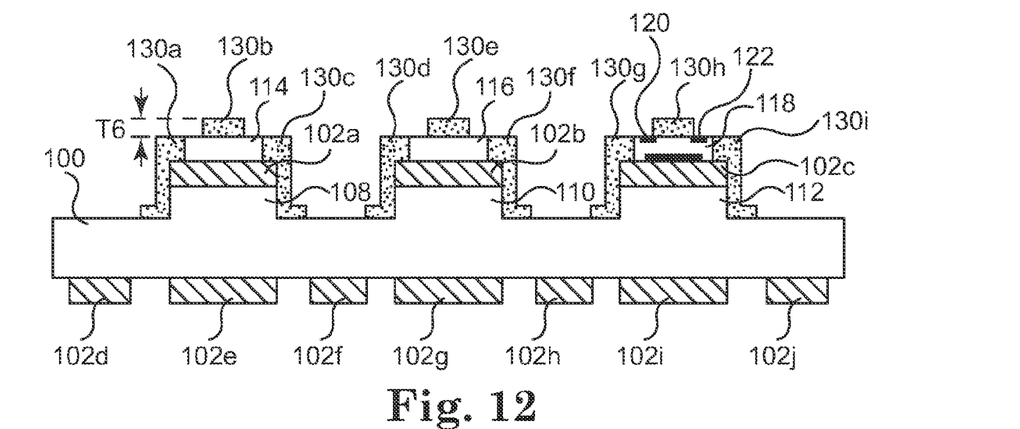
FIG. 12 is a diagram illustrating one embodiment of an insulating layer over the chips and the metal carrier.

FIG. 12 is a diagram illustrating one embodiment of an insulating layer 130a-130i over chips 114, 116 and 118 and metal carrier 100. The insulating layer 130a-130j is a dielectric layer applied over chips 114, 116 and 118 and metal carrier 100 and structured to provide access to chips 114, 116 and 118 and metal carrier 100. Insulating layer 130g-130i is structured to provide access to contacts 120 and 122 on chip 118. Also, insulating layer 130c and 130d is structured to provide access to metal carrier 100 and insulating layer 130f and 130g is structured to provide access to metal carrier 100.

Figure 13:
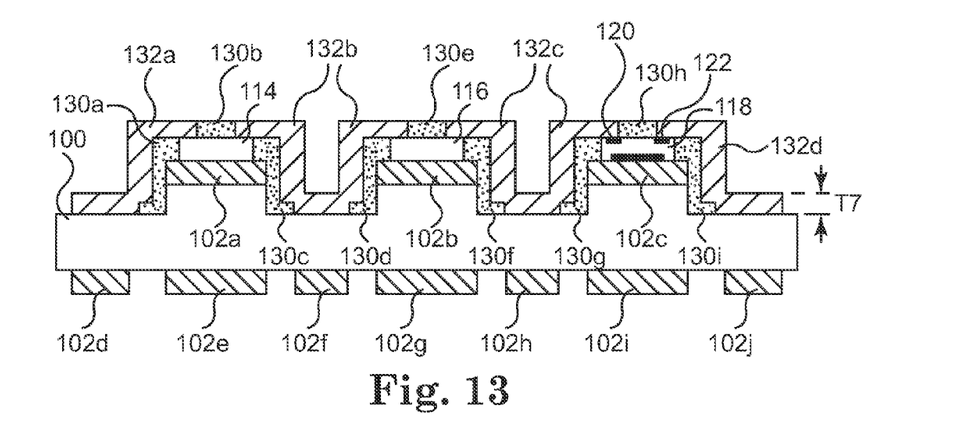
FIG. 13 is a diagram illustrating one embodiment of a metal layer applied over the chips and the metal carrier.

FIG. 13 is a diagram illustrating one embodiment of a metal layer 132a-132d applied over chips 114, 116 and 118 and metal carrier 100. Metal layer 132a-132d is applied over chips 114, 116 and 118, portions of insulating layer 130a-130i and metal carrier 100. Metal layer 132a-132d is structured to form conductive lines between chips 114, 116 and 118 and/or metal carrier 100. Metal layer 132c is electrically coupled to contact 120 and metal layer 132d is electrically coupled to contact 122. In one embodiment, metal layer 132a-132d is structured to provide electrically conductive lines that couple at least two of the chips 114, 116 and 118 together. In one embodiment, metal layer 132a-132d is structured to provide electrically conductive lines that couple at least one of the chips 114, 116 and 118 to metal carrier 100.

Metal layer 132a-132d has a metal layer thickness T7 in the range from 10 um to 250 um. In one embodiment, metal layer 132a-132d includes silver. In one embodiment, metal layer 132a-132d includes copper. In one embodiment, metal layer 132a-132d is applied via an electro-chemical (galvanic) process. In one embodiment, metal layer 132a-132d is applied via depositing a seed layer and electro-plating. In one embodiment, metal layer 132a-132d is applied via an inkjet process. In one embodiment, metal layer 132a-132d is applied via an inkjet process using nanoparticles, such as silver and/or copper nanoparticles, that melt at higher than 150 degrees centigrade.

Figure 14:
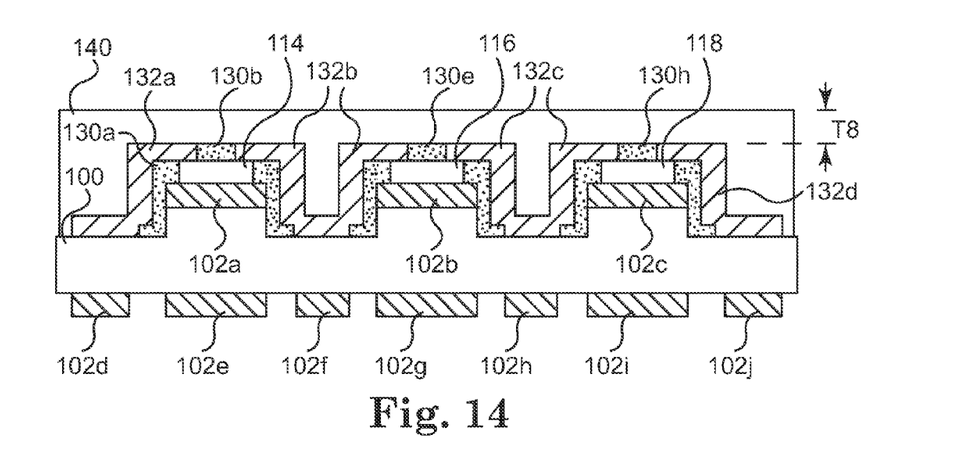
FIG. 14 is a diagram illustrating one embodiment of an encapsulation layer over the metal layer.

FIG. 14 is a diagram illustrating one embodiment of an encapsulation layer 140 over metal layer 132a-132d. Encapsulation layer 140 is applied over metal layer 132a-132d, insulating layer 130a-130i and metal carrier 100. In one embodiment, encapsulation layer 140 is applied via transfer molding. In one embodiment, encapsulation layer 140 is applied via casting. In one embodiment, encapsulation layer 140 is applied via a printing process.

Encapsulation layer 140 has a thickness T8 in the range from 50 um to 500 um above metal layer 132a-132d. In one embodiment, encapsulation layer 140 includes a molding compound. In one embodiment, encapsulation layer 140 includes a dielectric. In one embodiment, encapsulation layer 140 includes silicon and/or epoxy reinforced with particles and/or fiber.

Figure 15:
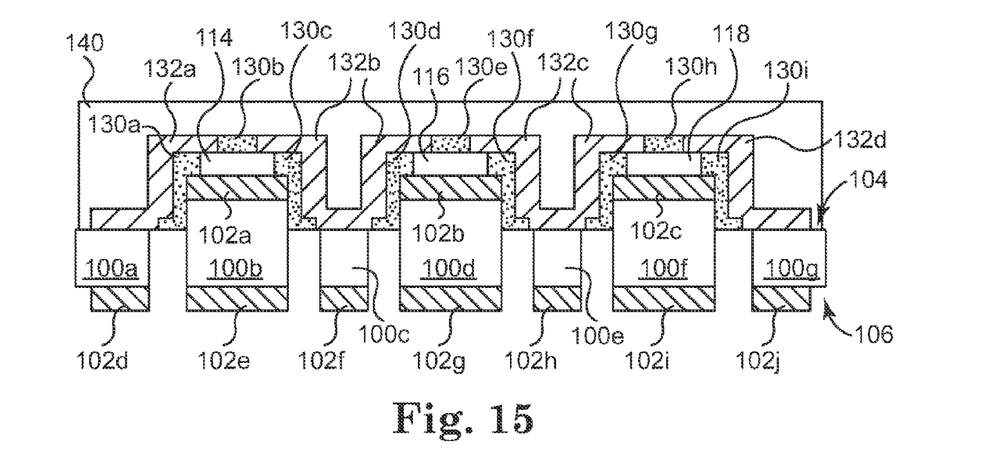
FIG. 15 is a diagram illustrating one embodiment of the metal carrier shown in FIG. 10 segmented after applying the metal layer.

FIG. 15 is a diagram illustrating one embodiment of a segmented metal carrier 100 after applying metal layer 132a-132d. Metal carrier 100 is segmented into metal carrier segments 100a-100g to obtain metal contact elements. Material from metal carrier 100 is removed from between metal carrier segments 100a-100g, back to portions of insulating layer 130a-130i and metal layer 132a-132d via second side 106. Material from metal carrier 100 is completely removed from between metal carrier segments 100a-100g to avoid short circuits.

In one embodiment, metal carrier 100 is segmented via etching metal carrier 100 from between portions of metal plating 102d-102j via second side 106. Metal plating 102d-102j is used as an etch stop layer to prevent etching away metal carrier 100 from under metal plating 102d-102j.

In one embodiment, metal carrier 100 is segmented via selective copper etching, such as chemical etching, where metal plating 102d-102j is used as an etch stop layer.

Figure 16:
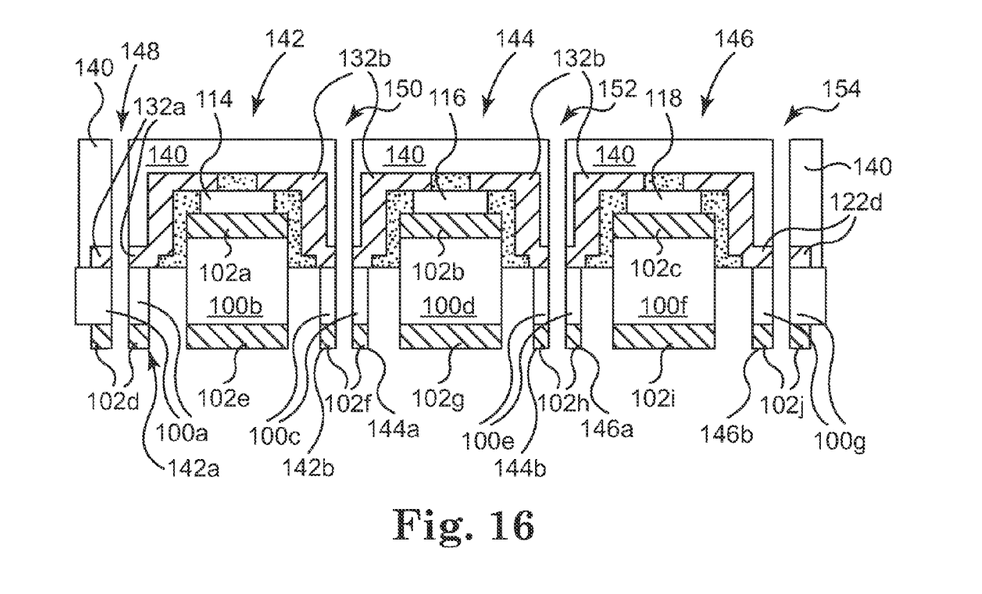
FIG. 16 is a diagram illustrating one embodiment of the metal layer and the encapsulation layer segmented to provide multiple semiconductor devices.

FIG. 16 is a diagram illustrating one embodiment of metal layer 132a-132d segmented to provide multiple semiconductor devices 142, 144 and 146. Encapsulation layer 140, metal layer 132a-132d, metal carrier segments 100a, 100c, 100e and 100g and metal plating 102d, 102f, 102h and 102j are segmented at 148, 150, 152 and 154 to provide multiple semiconductor devices 142, 144 and 146. Semiconductor device 142 includes chip 114, metal carrier segment 100b and metal contact elements 142a and 142b. Semiconductor device 144 includes chip 116, metal carrier segment 100d and metal contact elements 144a and 144b. Semiconductor device 146 includes chip 118, metal carrier segment 100f and metal contact elements 146a and 146b. In one embodiment, metal layer 132a-132d is segmented via etching. In one embodiment, metal layer 132a-132d is segmented via mechanical dicing, such as sawing. In one embodiment, metal layer 132a-132d is segmented via laser irradiation. In one embodiment, encapsulation layer 140 is segmented via etching. In one embodiment, encapsulation layer 140 is segmented via mechanical dicing, such as sawing. In one embodiment, encapsulation layer 140 is segmented via laser irradiation.

FIGS. 17-20 are diagrams illustrating one embodiment of a method of manufacturing semiconductor devices with bond wires 170a-170f. Metal carrier 160 is similar to metal carrier 100, metal plating 162a-162j is similar to metal plating 102a-102j and chips 164, 166 and 168 are similar to chips 114, 116 and 118, respectively.

Figure 17:
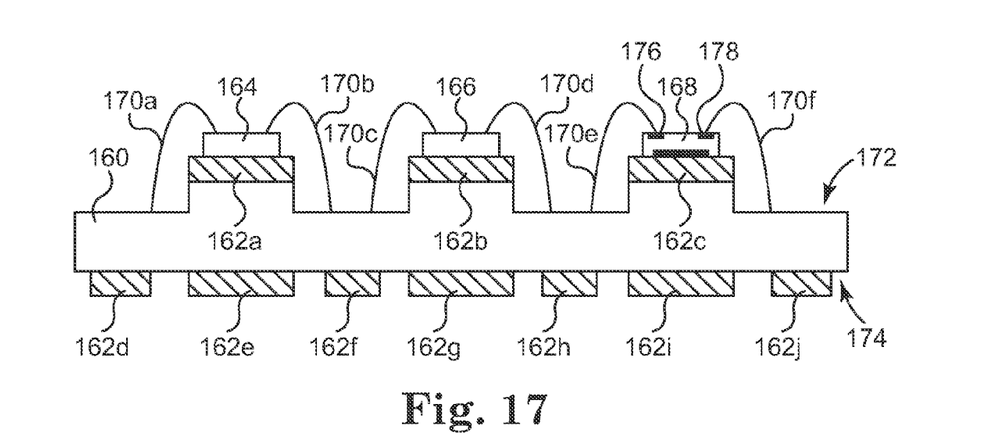
FIG. 17 is a diagram illustrating one embodiment of bond wires attached to a metal carrier and chips.

Metal carrier 160 includes a first side 172 and a second side 174 that opposes the first side 172. Metal plating 162a-162j is selectively plated on first side 172 and second side 174. Chips 164, 166 and 168 are attached to portions of metal plating 162a-162c, respectively.

FIG. 17 is a diagram illustrating one embodiment of bond wires 170a-170f attached to metal carrier 160 and chips 164, 166 and 168. Bond wires 170a and 170b are attached to chip 164 and metal carrier 160, bond wires 170c and 170d are attached to chip 166 and metal carrier 160 and bond wires 170e and 170f are attached to chip 168 and metal carrier 160.

Chips 164, 166 and 168 are electrically coupled to metal carrier 160 via bond wires 170a-170f. Chip 164 is electrically coupled to metal carrier 160 via bond wires 170a and 170b, chip 166 is electrically coupled to metal carrier 160 via bond wires 170c and 170d and chip 168 is electrically coupled to metal carrier 160 via bond wires 170e and 170f. On chip 168, contact 176 is electrically coupled to metal carrier 160 via bond wire 170e and contact 178 is electrically coupled to metal carrier 160 via bond wire 170f.

Figure 18:
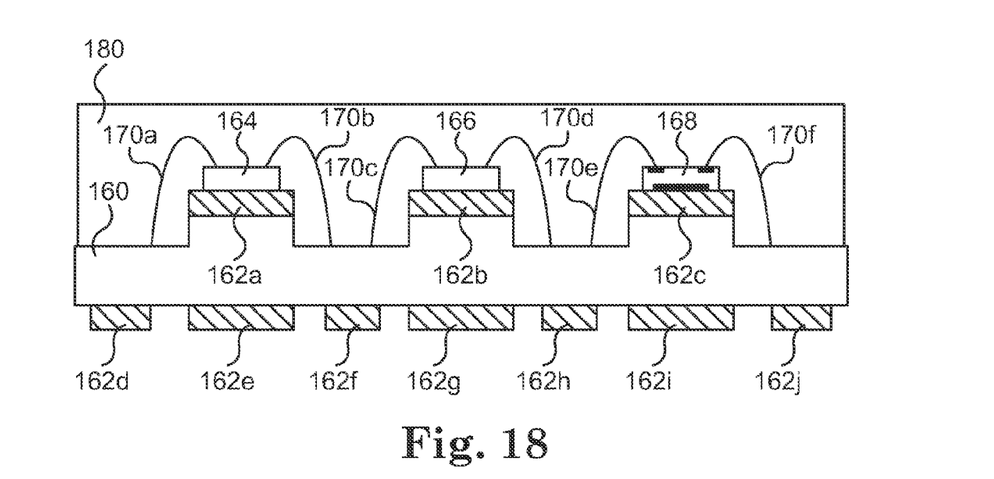
FIG. 18 is a diagram illustrating one embodiment of an encapsulation layer over the bond wires.

FIG. 18 is a diagram illustrating one embodiment of an encapsulation layer 180 over bond wires 170a-170f. In one embodiment, encapsulation layer 180 includes a molding compound. In one embodiment, encapsulation layer 180 includes a dielectric. In one embodiment, encapsulation layer 180 includes silicon and/or epoxy reinforced with particles and/or fiber.

Encapsulation layer 180 is applied over bond wires 170a-170f, chips 164, 166 and 168, metal plating 162a-162c and metal carrier 160. In one embodiment, encapsulation layer 180 is applied via transfer molding. In one embodiment, encapsulation layer 180 is applied via casting. In one embodiment, encapsulation layer 180 is applied via a printing process.

Figure 19:
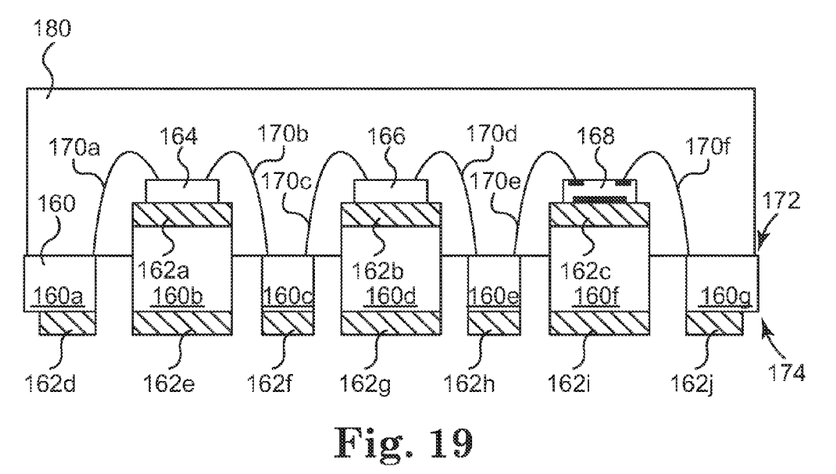
FIG. 19 is a diagram illustrating one embodiment of a segmented metal carrier after attaching the bond wires.

FIG. 19 is a diagram illustrating one embodiment of a segmented metal carrier 160 after attaching bond wires 170a-170f. Metal carrier 160 is segmented into metal carrier segments 160a-160g to obtain metal contact elements. Material from metal carrier 160 is removed from between metal carrier segments 160a-160g, back to encapsulation layer 180 via second side 174. Material from metal carrier 160 is completely removed from between metal carrier segments 160a-160g to avoid short circuits.

In one embodiment, metal carrier 160 is segmented via etching metal carrier 160 from between portions of metal plating 162d-162j via second side 174. Metal plating 162d-162j is used as an etch stop layer to prevent etching away metal carrier 160 from under metal plating 162d-162j.

In one embodiment, metal carrier 160 is segmented via selective copper etching, such as chemical etching, where metal plating 162d-162j is used as an etch stop layer.

Figure 20:
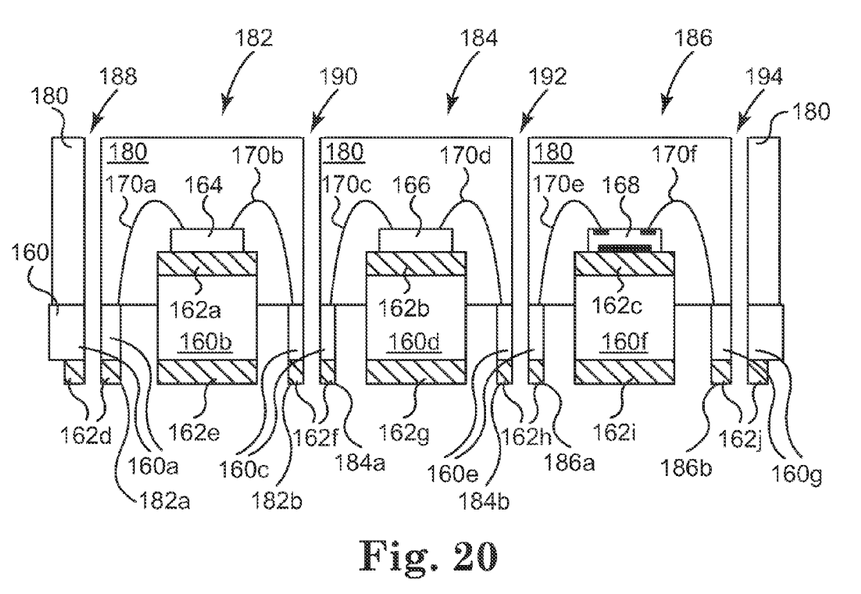
FIG. 20 is a diagram illustrating one embodiment that includes segmented metal plating to provide multiple semiconductor devices.

FIG. 20 is a diagram illustrating one embodiment that includes segmented metal plating 162d, 162f, 162h and 162j to provide multiple semiconductor devices 182, 184 and 186. Semiconductor device 182 includes chip 164, metal carrier segment 160b and metal contact elements 182a and 182b. Semiconductor device 184 includes chip 166, metal carrier segment 160d and metal contact elements 184a and 184b. Semiconductor device 186 includes chip 168, metal carrier segment 160f and metal contact elements 186a and 186b.

Encapsulation layer 180, metal carrier segments 160a, 160c, 160e and 160g and metal plating 162d, 162f, 162h and 162j are segmented at 188, 190, 192 and 194 to provide multiple semiconductor devices 182, 184 and 186. In one embodiment, metal plating 162d, 162f, 162h and 162j is segmented via etching. In one embodiment, metal plating 162d, 162f, 162h and 162j is segmented via mechanical dicing, such as sawing. In one embodiment, metal plating 162d, 162f, 162h and 162j is segmented via laser irradiation. In one embodiment, encapsulation layer 180 is segmented via etching. In one embodiment, encapsulation layer 180 is segmented via mechanical dicing, such as sawing. In one embodiment, encapsulation layer 180 is segmented via laser irradiation.

Methods of manufacturing semiconductor devices described herein result in packaged devices that have a slightly larger footprint area than the original die or substantially the same footprint area as the original die. These methods of manufacturing semiconductor devices reduce packaging time, inventory and costs.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, comprising:
   providing a metal carrier;
   attaching chips to the metal carrier;
   applying a metal layer over the chips and the metal carrier to electrically couple the chips to the metal carrier; and
   segmenting the metal carrier, after applying the metal layer, to provide metal contact elements that include first portions of the metal carrier separated from second portions of the metal carrier attached under the chips, wherein segmenting the metal carrier includes removing third portions of the metal carrier to expose the metal layer and separate the first portions of the metal carrier that are part of the contact elements from the second portions of the metal carrier that remain attached under the chips.

2. The method of claim 1, wherein segmenting the metal carrier comprises:
   etching the metal carrier.

3. The method of claim 1, comprising:
   segmenting the metal layer to obtain multiple semiconductor devices.

4. The method of claim 3, wherein segmenting the metal layer comprises at least one of etching, sawing and laser irradiation.

5. The method of claim 1, wherein applying a metal layer comprises:
   applying the metal layer via a galvanic process.

6. The method of claim 1, comprising:
   applying an insulating layer over the chips and the metal carrier prior to applying the metal layer.

7. The method of claim 6, comprising:
   structuring the insulating layer to provide access to the chips and the metal carrier prior to applying the metal layer.

8. The method of claim 1, comprising:
   structuring the metal layer to form conductive lines between the chips and the metal carrier.

9. The method of claim 1, comprising:
   applying an encapsulation material over the metal layer.

10. The method of claim 9, comprising:
    segmenting the encapsulation material to obtain multiple semiconductor devices.

11. The method of claim 10, wherein segmenting the encapsulation material comprises at least one of etching, sawing and laser irradiation.

12. The method of claim 1, wherein attaching chips comprises:
    attaching each of the chips to the metal carrier with at least one contact element on each of the chips facing away from the metal carrier.

13. The method of claim 1, wherein attaching chips comprises:
    attaching each of the chips to the metal carrier with at least one contact element on each of the chips facing the metal carrier.

14. The method of claim 1, wherein attaching chips comprises:
    attaching each of the chips to the metal carrier with at least one transistor on each of the chips having a first electrode facing the metal carrier and a second electrode facing away from the metal carrier.

15. The method of claim 1, wherein attaching chips comprises:
    attaching a first chip that comprises a power transistor; and
    attaching a second chip that is different than the first chip.

16. The method of claim 15, comprising:
structuring the metal layer to provide electrically conductive lines that couple at least two of the first chip, the second chip and the metal carrier.

17. The method of claim 1, wherein the metal carrier is one of a metal plate and a metal foil.

18. A method of manufacturing a semiconductor device, comprising:
providing a metal carrier having a first side and a second side that opposes the first side;
plating the metal carrier selectively on the first side and the second side;
attaching chips to the plating on the first side, such that bottoms of the chips are directly connected to the plating on the first side;
applying an insulating layer over the chips and the metal carrier, such that the insulating layer covers the metal carrier and completely covers tops and sides of the chips;
structuring the insulating layer to provide access to the tops of the chips and the metal carrier;
attaching conductors to the chips and the metal carrier to electrically couple the chips to the metal carrier, wherein attaching conductors comprises applying a metal layer over the chips and the metal carrier and the insulating layer after the insulating layer has been structured; and
segmenting the metal carrier from the second side between the plating on the second side and after attaching the conductors to provide metal carrier contact elements.

19. The method of claim 18, wherein segmenting the metal carrier comprises:
using the plating on the second side as an etch stop material; and
etching the metal carrier between the plating on the second side.

20. A method of manufacturing a semiconductor device, comprising:
providing a metal carrier;
attaching chips to the metal carrier, such that bottoms of the chips are directly connected to metal of the metal carrier;
applying an insulating layer over the chips and the metal carrier, such that the insulating layer covers the metal carrier and tops and sides of the chips;
structuring the insulating layer to expose portions of the tops of the chips and first portions of the metal carrier;
applying a metal layer over the chips and the metal carrier and the insulating layer to electrically couple exposed portions of the tops of the chips to exposed first portions of the metal carrier, wherein the insulating layer is situated between the metal layer and the sides of the chips and between the metal layer and second portions of the metal carrier; and
segmenting the metal carrier, after applying the metal layer, to obtain metal contact elements, wherein segmenting the metal carrier includes removing third portions of the metal carrier to expose the insulating layer and the metal layer.

* * * * *